US006992524B2

(12) United States Patent
Yang et al.

(10) Patent No.: US 6,992,524 B2
(45) Date of Patent: *Jan. 31, 2006

(54) QUIESCENT CURRENT CONTROL CIRCUIT FOR HIGH-POWER AMPLIFIERS

(75) Inventors: Youngoo Yang, Thousand Oaks, CA (US); Kevin Choi, Thousand Oaks, CA (US); Bong-Seok Park, Thousand Oaks, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/658,234

(22) Filed: Sep. 8, 2003

(65) Prior Publication Data

US 2005/0052224 A1 Mar. 10, 2005

(51) Int. Cl.
*G05F 3/02* (2006.01)
*H03G 3/10* (2006.01)
(52) U.S. Cl. ...................... 327/540; 327/484; 330/296
(58) Field of Classification Search ................. 327/108, 327/478, 482, 485–486, 488–489, 544; 330/288, 330/289, 296
See application file for complete search history.

(56) References Cited

U.S. PATENT DOCUMENTS

| 6,043,714 | A  | * | 3/2000  | Yamamoto et al. | 330/296 |
| 6,331,799 | B1 | * | 12/2001 | Miyazawa | 327/538 |
| 6,437,647 | B1 | * | 8/2002  | Fowler | 330/288 |
| 6,452,454 | B1 | * | 9/2002  | Shapiro et al. | 330/289 |
| 6,566,954 | B2 | * | 5/2003  | Miyazawa | 330/285 |
| 6,617,928 | B2 | * | 9/2003  | Finlay et al. | 330/288 |
| 6,803,822 | B2 | * | 10/2004 | Kim et al. | 330/296 |
| 2005/0030105 | A1 | * | 2/2005 | Yang et al. | 330/296 |
| 2005/0062528 | A1 | * | 3/2005 | Kuriyama | 330/133 |

* cited by examiner

*Primary Examiner*—Timothy P. Callahan
*Assistant Examiner*—Terry L. Englund
(74) *Attorney, Agent, or Firm*—Farjami & Farjami LLP

(57) ABSTRACT

A bias control circuit for controlling a bias circuit coupled to an amplifier transistor. The bias control circuit receives a control voltage, and actively adjusts an equivalent resistance of the bias control circuit responsive to the control voltage, wherein the equivalent resistance is established between a first node and a reference voltage. In one embodiment, when the control voltage is increased, the equivalent resistance is gradually decreased and a current drawn by the bias control circuit is gradually increased, resulting in a quiescent current of the amplifier transistor being gradually increased.

18 Claims, 3 Drawing Sheets

QUIESCENT CURRENT CONTROL CIRCUIT
FOR HIGH-POWER AMPLIFIERS

BACKGROUND OF THE INVENTION

1. Field of the Invention

The present invention is generally in the field of semiconductors. More specifically, the invention is in the field of semiconductor circuits and amplifiers.

2. Related Art

Amplifiers based on bipolar technology are widely used in a variety of applications, including wireless communication, such as radio frequency ("RF") communication, for example. Bias circuits perform an important function by supplying a base bias current to bipolar transistors for controlling the operation modes of the bipolar transistors in amplifiers.

Digital mode control circuits have been used to reduce current and power consumption for low power mode operation in high-power amplifiers. Digital mode controls circuits, however, have a single and abrupt transition point from low power mode to high power mode, which substantially limits current consumption savings, particularly during very low power mode operation.

In an effort to improve current consumption savings, CMOS circuitry in an additional CMOS die have been employed in high-power amplifiers. With this arrangement, CMOS circuitry can provide improved analog control voltage into the base bias of the bipolar transistor of the amplifier, resulting in a substantially continuous quiescent current transition from a very low power level. In this way, current consumption can be greatly reduced even at low power modes. The addition of a separate CMOS die to the amplifier, however, results in increased device size and increased costs, both of which are undesirable.

Accordingly, there is a strong need in the art for a quiescent current control circuit for high-power amplifiers.

SUMMARY OF THE INVENTION

The present invention is directed to a quiescent current control circuit for high-power amplifiers. In one exemplary embodiment, the control circuit controls a bias circuit coupled to an amplifier, such as a high-power CDMA (Code Division Multiple Access) amplifier. The bias circuit includes a first bias transistor, a second bias transistor, and a third bias transistor, wherein a base of the amplifier transistor is coupled to an emitter of the second bias transistor, a base of the second bias transistor is coupled to a base of the first bias transistor and to a collector of the third bias transistor, and a base of the third bias transistor is coupled to an emitter of the first bias transistor and to the bias control circuit at a first node.

In one embodiment, the bias control circuit comprises means for receiving a control voltage, and means for actively adjusting an equivalent resistance of the bias control circuit responsive to the control voltage, wherein the equivalent resistance is established between the first node and a reference voltage, such as ground. For example, in one embodiment, when the control voltage is increased, the equivalent resistance is gradually decreased and a current drawn by the bias control circuit is gradually increased, resulting in a quiescent current of the amplifier transistor being gradually increased. As such, continuous quiescent current control of the amplifier transistor is achieved, resulting in significant current and power consumption savings.

According to one embodiment, the bias control circuit, the bias circuit and the amplifier transistor are based on bipolar technology. As such, the bias control circuit, the bias circuit and the amplifier transistor can be integrated into a single die, resulting in significant reduction in device size and device cost.

Other features and advantages of the present invention will become more readily apparent to those of ordinary skill in the art after reviewing the following detailed description and accompanying drawings.

DETAILED DESCRIPTION OF THE INVENTION

The present invention is directed to a quiescent current control circuit for high-power amplifiers. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
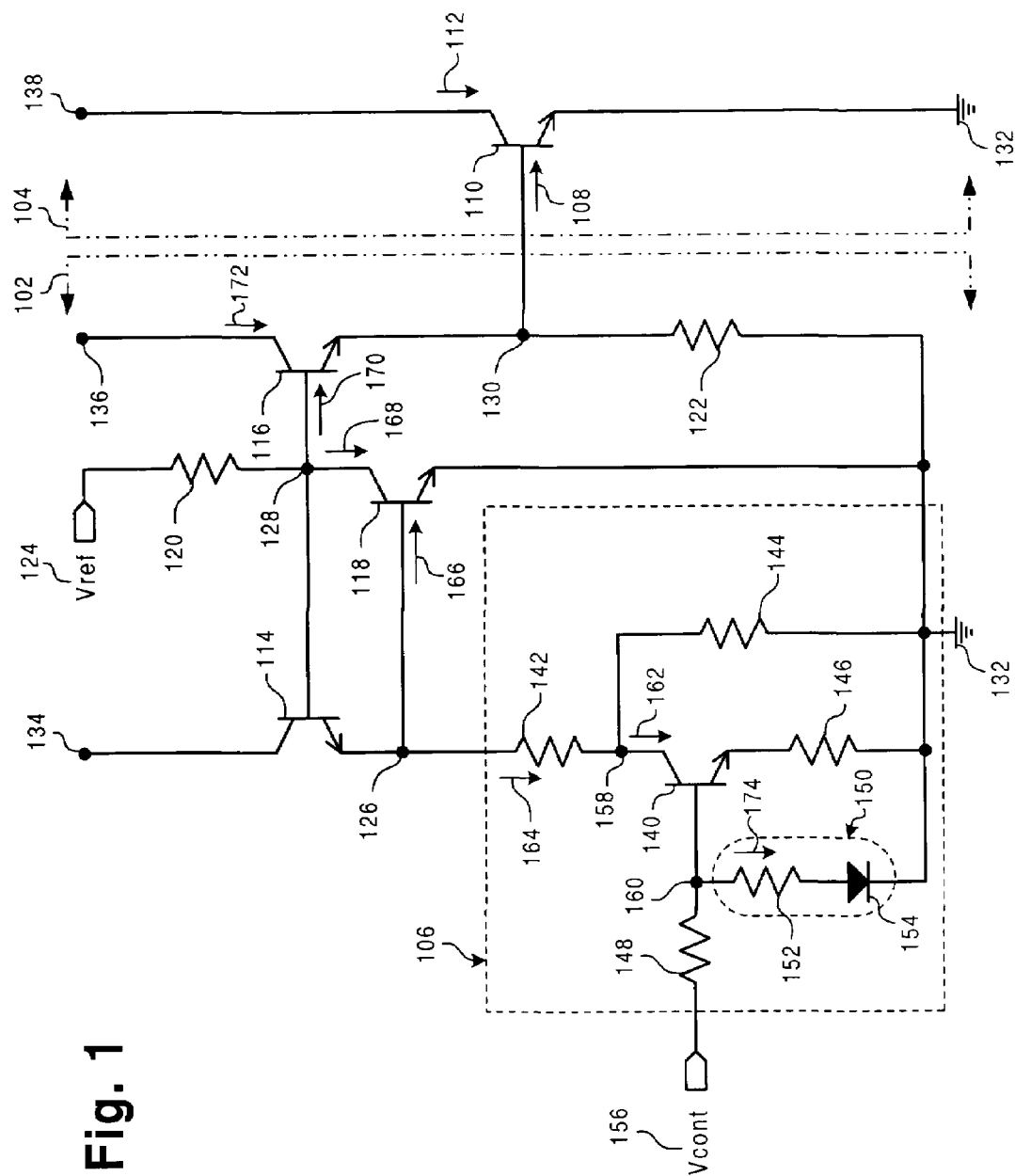
FIG. 1 shows a circuit diagram of an exemplary bias circuit for a high-power amplifier according to one embodiment of the present invention.

Referring to FIG. 1, there is shown a circuit diagram of exemplary bias circuit 102 including control circuit 106 according to one embodiment of the present invention. In FIG. 1, bias circuit 102 is coupled to and supplies base bias current 108 ("Ib 108") to amplifier transistor 110 of amplifier 104. Amplifier 104 may, for example, be a high-power amplifier, such as a high-power CDMA handset amplifier, and amplifier transistor 110 may for example, be a large heterojunction bipolar transistor ("HBT"). As discussed below, control circuit 106 is based on bipolar technology and be integrated into the same die as bias circuit 102 and amplifier 104. Also discussed below, control circuit 106 achieves dynamic and continuous control of quiescent current 112 ("Icq 112") of amplifier transistor 110, resulting in significantly reduced current and power consumption.

As shown in FIG. 1, bias circuit 102 comprises bias transistors 114, 116 and 118, and resistors 120 and 122. Bias transistors 114, 116 and 118 comprise bipolar transistors, wherein a base of bias transistor 114 is connected at node 128 to a base of bias transistor 116 and to a collector of bias transistor 118. Bias transistor 114 further has an emitter connected at node 126 to control circuit 106 and to a base of bias transistor 118. An emitter of bias transistor 118 is connected to a reference voltage, such as ground 132. Bias transistor 116 further has an emitter connected at node 130 to a base of amplifier transistor 110. An emitter of amplifier transistor 110 is connected to a reference voltage, such as ground 132.

According to one embodiment, resistor 120 is approximately 1 to 2 kiloOhms (kΩ) and is connected across reference voltage ("Vref") 124 and node 128, and resistor 122 is approximately 0.5 to 1 kΩ and is connected across node 130 and a reference voltage, such as ground 132. According to another embodiment, resistor 122 may be omitted, wherein the emitter of bias transistor 116 is connected only to the base of amplifier transistor 110. Nodes 134, 136 and 138 may be connected to a bias voltage or may be directly connected to a supply voltage ("VCC"), as is known in the art.

Control circuit 106 is connected across node 126 and a reference voltage, such as ground 132. As shown in FIG. 1, control circuit 106 comprises bias control transistor 140 and resistors 142, 144, 146 and 148. Resistor 142 is connected across node 126 and node 158 and, according to one embodiment, is approximately 2 kΩ. Resistor 144 is connected across node 158 and a reference voltage, such as ground 132 and, according to one embodiment, is approximately 100 kΩ. Resistor 146 is connected across an emitter of bias control transistor 140 and a reference voltage, such as ground 132 and, according to one embodiment, is approximately 100 Ω. Bias control transistor 140 comprises a bipolar transistor and has a collector connected to node 158 and a base connected to node 160. Resistor 148 is connected across node 160 and a control voltage ("Vcont") 156 and, according to one embodiment, is approximately 10 kΩ.

In operation, control circuit 106 receives Vcont 156 and provides a "reference" resistance corresponding to an equivalent resistance ("Req") across node 126 and ground 132. Req determines the status of bias circuit 102, which in turn determines the status of Icq 112 of amplifier 104. In control circuit 106, bias control transistor 140 operates as an active resistor controlled by Vcont 156, such that as Vcont 156 is increased from a low level to a high level, Req is gradually decreased. Vcont 156, for example, may have a low level of approximately 0 to 1.1 volts ("V") and a high level of approximately 2 to 3 V. Resistor 142 establishes the primary resistance of Req for high mode operation and operates to restrict Icq 112 at high Vcont 156, and resistor 144 establishes the primary resistance of Req for low mode operation and operates for baseline Icq 112 at very low Vcont 156.

With this arrangement, as Vcont 156 is increased from a low level, bias control transistor 140 is gradually turned on, resulting in a gradual increase of collector current ("Ic") 162 of bias control transistor 140. As Ic 162 is gradually increased, Req of control circuit 106 is dynamically reduced such that control circuit 106 draws increased current 164, resulting in a decrease in base current ("Ib") 166 and Ic 168 of bias transistor 118. Decreased Ic 168 results in increased Ib 170 and Ic 172 of bias transistor 116, further resulting in increased Vb of amplifier transistor 110 at node 130, and further in increased Ib 108 and Icq 112 of amplifier transistor 110.

Due to the particular arrangement of control circuit 106 and bias circuit 102, significantly improved analog control over Vb of amplifier transistor 110 by control circuit 106 is achieved, such that continuous Icq 112 transition from a very low power level can be provided, which results in significant current savings. Since control circuit 106 is based on bipolar technology, control circuit 106 may be integrated in to the same die as bias circuit 102 and amplifier 104, resulting in substantial cost savings and significantly reduced device size.

As shown in FIG. 1, control circuit 106 may further include temperature compensation circuit 150 comprising resistor 152 and diode 154. Resistor 152 is connected across node 160 and an anode of diode 154 and, according to one embodiment, is approximately 2 to 5 kΩ. Diode 154 may, for example, be an HBT diode, and further has a cathode connected to a reference voltage, such as ground 132. In the absence of temperature compensation circuit 150, at high temperatures, the requisite forward bias voltage (corresponding to the base-to-emitter voltage ("Vbe")) of bias control transistor 140 drops, resulting in an increase in Ic 162 of bias control transistor 140 and a corresponding decrease in the Req of control circuit 106. However, with resistor 152 and diode 154 coupled to the base of bias control transistor 140 at node 160, diode 154 offsets any increase in Ic 162 by drawing a corresponding increased current 174 from node 160 to ground 132, since at high temperatures, the requisite forward bias voltage for diode 154 decreases for the same reason that the requisite forward bias voltage of bias control transistor 140 drops. As a result, greater control and accuracy of Req of control circuit 106 are achieved even at high temperatures, which, as discussed above, provides significantly improved analog control over Vb of amplifier transistor 110 and improved continuous control of Icq 112 of amplifier transistor 110, resulting in significantly reduced current and power consumption.

Figure 2:
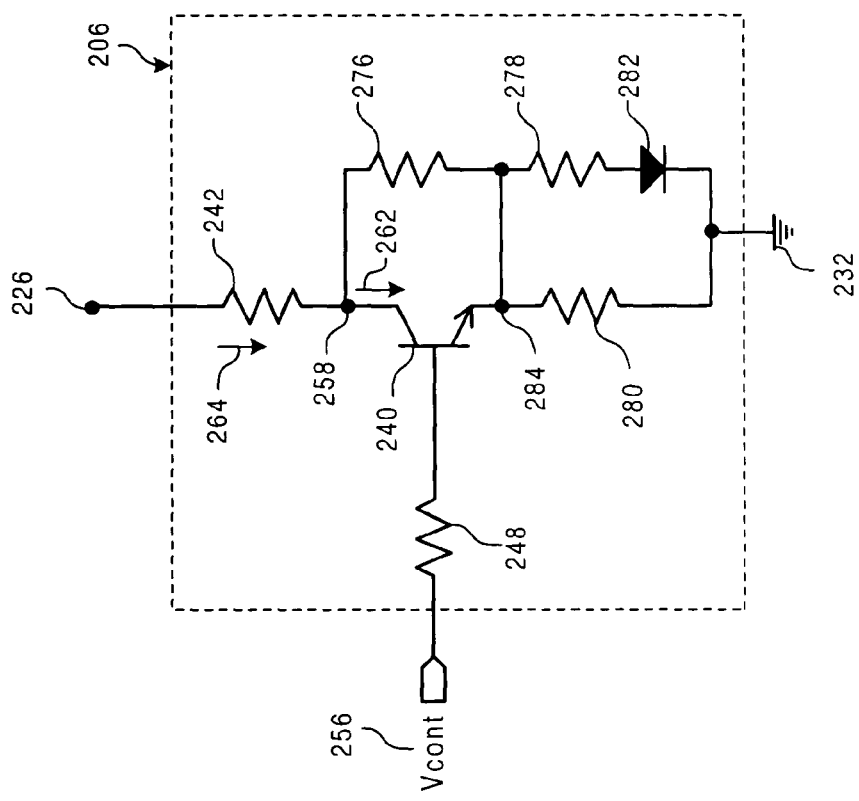
FIG. 2 shows a circuit diagram of an exemplary control circuit according to one embodiment of the present invention.

Referring now to FIG. 2, exemplary control circuit 206 according another embodiment of the present invention is shown. Control circuit 206 may be used to control bias circuit 102 of FIG. 1 and to provide continuous control of quiescent current 112 of amplifier transistor 110 as described above, wherein control circuit 206 replaces control circuit 106 of FIG. 1, and wherein node 226, Vcont 256 and ground 232 respectively corresponds to node 126, Vcont 156 and ground 132 of FIG. 1.

As shown in FIG. 2, control circuit 206 comprises bias control transistor 240, resistors 242, 248, 276, 278 and 280, and diode 282. Resistor 242 is connected across node 226 and node 258 and, according to one embodiment, is approximately 2 kΩ. Resistor 276 is connected across node 258 and node 284 and, according to one embodiment, is approximately 100 kΩ. Resistor 278 is connected across node 284 and an anode of diode 282 and, according to one embodiment, is approximately 10 to 20 Ω. Diode 282 may, for example, be a Schottky diode having a turn on forward bias voltage of approximately 0.5 V, and further has a cathode connected to a reference voltage, such as ground 232. Resistor 280 is connected across node 284 and a reference voltage, such as ground 232 and, according to one embodiment, is approximately 100 Ω. Bias control transistor 240 comprises a bipolar transistor and has a collector connected to node 258 and an emitter connected to node 284. Resistor 248 is connected across a base of bias control transistor 240 and Vcont 156 and, according to one embodiment, is approximately 10 kΩ.

In operation, control circuit 206 operates in substantially the same manner as described above in conjunction with control circuit 106 of FIG. 1. Thus, as Vcont 256 is increased from a low level, bias control transistor 240 is gradually turned on, resulting in a gradual increase of collector current ("Ic") 262 of bias control transistor 240. As Ic 262 is gradually increased, Req of control circuit 206 is dynamically reduced such that control circuit 206 draws increased current 264, and as discussed above in conjunction with FIG. 1, further results in increased Vb of amplifier transistor 110 at node 130, and in increased Ib 108 and Icq 112 of amplifier transistor 110. Due to the particular arrangement of control circuit 206, significantly improved analog control over Vb of amplifier transistor 110 by control circuit 106 is achieved, such that continuous Icq 112 transition from a very low power level can be provided, which results in significant current savings.

Control circuit 206 of FIG. 2 further includes resistor 278 and diode 282 connected across node 284 and ground 232. In this particular arrangement, resistor 278 and diode 282 operate to reduce the requirement of having very high Vcont 252 for high mode operation. According to another embodiment, temperature compensation circuit 150 of FIG. 1 could be connected between resistor 248 and the base of bias control transistor 240 of FIG. 2 to provide temperature compensation and improved continuous control of quiescent current 112 of amplifier transistor 110 as described above.

Figure 3:
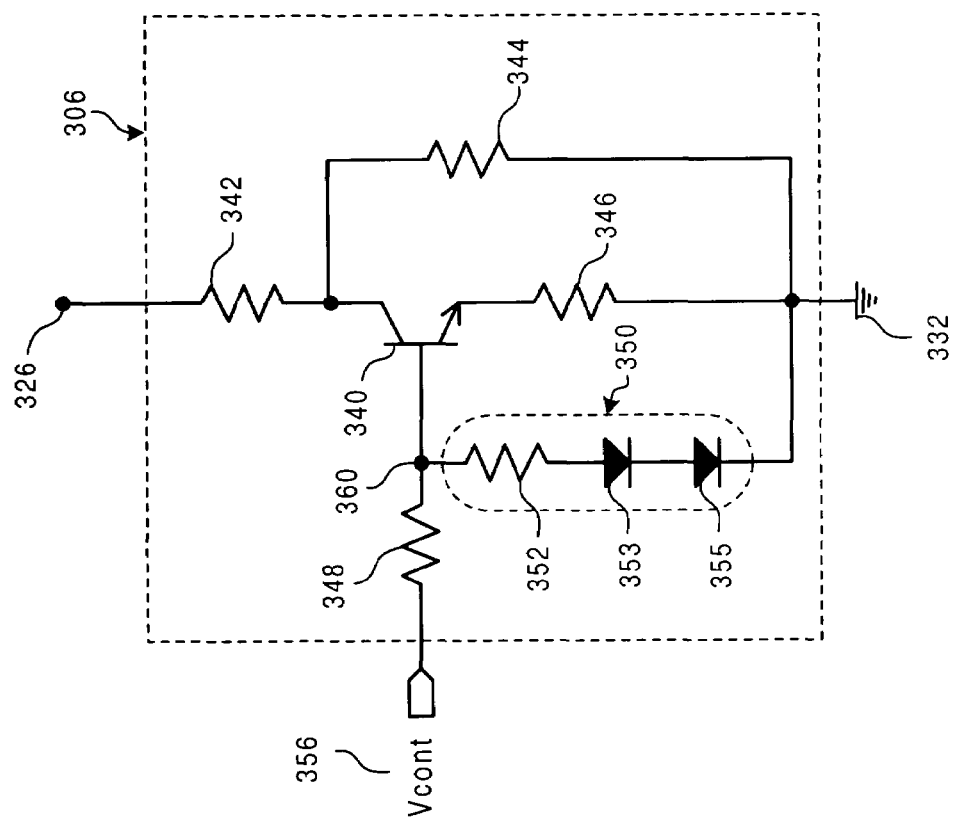
FIG. 3 shows a circuit diagram of an exemplary control circuit according to another embodiment of the present invention.

Referring now to FIG. 3, exemplary control circuit 306 according another embodiment of the present invention is shown. Control circuit 306 may be used to control bias circuit 102 of FIG. 1 and to provide continuous control of quiescent current 112 of amplifier transistor 110 as described above, wherein control circuit 306 replaces control circuit 106 of FIG. 1.

In FIG. 3, Vcont 356, node 326, ground 332, bias control transistor 340 and resistors 342, 344, 346 and 348 respectively correspond to Vcont 156, node 126, ground 132, bias control transistor 140 and resistors 142, 144, 146 and 148 in FIG. 1. Also shown in FIG. 3, temperature compensation circuit 350 is connected at node 360 to the base of bias control transistor 340. Temperature compensation circuit 350 comprises resistor 352 and diodes 353 and 355. Resistor 352 is connected across node 360 and an anode of diode 353. A cathode of diode 353 is connected to an anode of diode 355, and a cathode of diode 355 is connected to a reference voltage, such as ground 332. Diodes 353 and 355 may, for example, be Schottky diodes, each diode 353 and 355 having a turn on forward bias voltage of approximately 0.5 V. In this way, diodes 353 and 355 have a functionally equivalent turn on forward bias voltage (i.e., measured across the anode of diode 353 and the cathode of diode 355) of approximately 1 to 1.2 V. Thus, operation of control circuit 306 operates in substantially the same manner described above in conjunction with control circuit 106 of FIG. 1.

In sum, a quiescent current control circuit for high-power amplifiers is achieved according to various embodiments of the present invention, whereby significant analog continuous control over the quiescent current of an amplifier is achieved, resulting in significantly reduced current and power consumption, particularly for low mode operation. Furthermore, improved temperature compensation is achieved by the control circuit of the present invention, resulting in improved control over the quiescent current of an amplifier. Moreover, the control circuit of the present invention is based on bipolar technology, allowing the control circuit to be integrated into the same die as the bias circuit and the amplifier, resulting in significant cost savings and reduced device size.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, the particular resistive values for bias circuit 102 and control circuits 106, 206 and 306 discussed above can be modified without departing from the scope of the present invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a quiescent current control circuit for high-power amplifiers has been described.

What is claimed is:

1. A bias control circuit for a bias circuit, said bias circuit being coupled to an amplifier transistor, said bias circuit including a first bias transistor, a second bias transistor, and a third bias transistor, a base of said amplifier transistor being coupled to an emitter of said second bias transistor, a base of said second bias transistor being coupled to a base of said first bias transistor and to a collector of said third bias transistor, a base of said third bias transistor being coupled to an emitter of said first bias transistor and to said bias control circuit at a first node, said bias control circuit comprising:
   means for receiving a control voltage; and
   means for actively adjusting an equivalent resistance of said bias control circuit responsive to said control voltage, said equivalent resistance being established between said first node and a reference voltage.

2. The bias control circuit of claim 1, wherein said equivalent resistance is gradually decreased when said control voltage is increased.

3. The bias control circuit of claim 1, wherein a current drawn by said bias control circuit is gradually increased when said control voltage is increased.

4. The bias control circuit of claim 1, wherein a quiescent current of said amplifier transistor is gradually increased when said control voltage is increased.

5. The bias control circuit of claim 1, wherein said bias control circuit, said bias circuit and said amplifier transistor are integrated into a single die.

6. The bias control circuit of claim 1, wherein said amplifier transistor is a high-power CDMA transistor.

7. The bias control circuit of claim 1, wherein said reference voltage is ground.

8. A bias control circuit for a bias circuit, said bias circuit being coupled to an amplifier transistor, said bias circuit including a first bias transistor, a second bias transistor, and a third bias transistor, a base of said amplifier transistor being coupled to an emitter of said second bias transistor, a base of said second bias transistor being coupled to a base of said first bias transistor and to a collector of said third bias transistor, a base of said third bias transistor being coupled to an emitter of said first bias transistor and to said bias control circuit at a first node, said bias control circuit comprising:
   a bias control transistor having a base, a collector, and an emitter;
   a first resistor connected across said collector of said bias control transistor and said first node;
   a second resistor connected across said collector of said bias control transistor and a first reference voltage;
   a third resistor connected across said emitter of said bias control transistor and said first reference voltage; and
   a fourth resistor connected across a control voltage and said base of said bias control transistor, wherein said bias control transistor actively adjusts an equivalent resistance of said bias control circuit responsive to said control voltage, said equivalent resistance being established between said first node and said first reference voltage.

9. The bias control circuit of claim 8, wherein said amplifier transistor, said first bias transistor, said second bias transistor, said third bias transistor and said bias control transistor are integrated into a single die.

10. The bias control circuit of claim 8, further comprising a fifth resistor connected across said base of said first bias transistor and a second reference voltage, and a sixth resistor connected across said emitter of said second bias transistor and said first reference Voltage.

11. The bias control circuit of claim 8, further comprising a temperature compensation circuit comprising a fifth resistor and at least one diode, wherein a first end of said fifth resistor is connected to said base of said bias control transistor, a second end of said fifth resistor is connected to an anode of said at least one diode, a cathode of said at least one diode being connected to said first reference voltage.

12. The bias control circuit of claim 11, wherein said at least one diode comprises an HBT diode.

13. The bias control circuit of claim 8, further comprising a temperature compensation circuit comprising a fifth resistor and first and second Schottky diodes, wherein a first end of said fifth resistor is connected to said base of said bias control transistor, a second end of said fifth resistor is connected to an anode of said first Schottky diode, a cathode of said first Schottky diode being connected to an anode of said second Schottky diode, a cathode of said second Schottky diode being connected to said first reference voltage.

14. A bias control circuit for a bias circuit, said bias circuit being coupled to an amplifier transistor, said bias circuit including a first bias transistor, a second bias transistor, and a third bias transistor, a base of said amplifier transistor being coupled to an emitter of said second bias transistor, a base of said second bias transistor being coupled to a base of said first bias transistor and to a collector of said third bias transistor, a base of said third bias transistor being coupled to an emitter of said first bias transistor and to said bias control circuit at a first node, said bias control circuit comprising:

a bias control transistor having a base, a collector, and an emitter;

a first resistor connected across said collector of said bias control transistor and said first node;

a second resistor connected across said collector of said bias control transistor and said emitter of said bias control transistor;

a third resistor connected across said emitter of said bias control transistor and a first reference voltage;

a fourth resistor connected across said emitter of said bias control transistor and an anode of a first diode, said first diode having a cathode connected to said first reference voltage; and a fifth resistor connected across a control voltage and said base of said bias control transistor, wherein said bias control transistor actively adjusts an equivalent resistance of said bias control circuit responsive to said control voltage, said equivalent resistance being established between said first node and said first reference voltage.

15. The bias control circuit of claim 14, wherein said amplifier transistor, said first bias transistor, said second bias transistor, said third bias transistor, and said bias control transistor are integrated into a single die.

16. The bias control circuit of claim 14, further comprising a sixth resistor connected across said base of said first bias transistor and a second reference voltage, and a seventh resistor connected across said emitter of said second bias transistor and said first reference voltage.

17. The bias control circuit of claim 14, further comprising a temperature compensation circuit comprising a sixth resistor and at least one additional diode, wherein a first end of said sixth resistor is connected to said base of said bias control transistor, a second end of said sixth resistor is connected to an anode of said at least one additional diode, a cathode of said at least one additional diode being connected to said first reference voltage.

18. The bias control circuit of claim 14, wherein said first reference voltage is ground.

* * * * *